(12) United States Patent
Chou et al.

(10) Patent No.: US 10,340,350 B2
(45) Date of Patent: Jul. 2, 2019

(54) SEMICONDUCTOR STRUCTURE AND MANUFACTURING METHOD THEREOF

(71) Applicant: UNITED MICROELECTRONICS CORP., Hsinchu (TW)

(72) Inventors: Shih-Min Chou, Tainan (TW); Yun-Tzu Chang, Kaohsiung (TW); Wei-Ning Chen, Tainan (TW); Wei-Ming Hsiao, Yuanli Township, Miaoli County (TW); Chia-Chang Hsu, Kaohsiung (TW); Kuo-Chih Lai, Tainan (TW); Yang-Ju Lu, Changhua (TW); Yen-Chen Chen, Tainan (TW); Chun-Yao Yang, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/044,581

(22) Filed: Jul. 25, 2018

(65) Prior Publication Data

US 2018/0331193 A1    Nov. 15, 2018

Related U.S. Application Data

(62) Division of application No. 15/453,351, filed on Mar. 8, 2017, now Pat. No. 10,074,725.

(51) Int. Cl.
*H01L 29/76* (2006.01)
*H01L 29/94* (2006.01)
*H01L 29/423* (2006.01)
*H01L 29/06* (2006.01)
*H01L 29/49* (2006.01)

(Continued)

(52) U.S. Cl.
CPC .. *H01L 29/42356* (2013.01); *H01L 21/02183* (2013.01); *H01L 21/02244* (2013.01); *H01L 21/02252* (2013.01); *H01L 21/02255* (2013.01); *H01L 21/28088* (2013.01); *H01L 21/32134* (2013.01); *H01L 21/762* (2013.01); *H01L 21/823842* (2013.01); *H01L 27/0886* (2013.01); *H01L 27/0924* (2013.01); *H01L 29/0649* (2013.01); *H01L 29/4966* (2013.01); *H01L 29/511* (2013.01); *H01L 29/518* (2013.01);

(Continued)

(58) Field of Classification Search
CPC .............. H01L 29/4236; H01L 21/324; H01L 21/28088; H01L 29/772
USPC ......................................................... 257/401
See application file for complete search history.

(56) References Cited

U.S. PATENT DOCUMENTS

7,060,571 B1    6/2006 Ngo et al.
9,276,112 B2 *  3/2016 Bohr ..................... H01L 29/045
(Continued)

*Primary Examiner* — Theresa T Doan
(74) *Attorney, Agent, or Firm* — WPAT, PC (57) ABSTRACT

A semiconductor structure and a manufacturing method thereof are provided. The semiconductor structure includes an isolation layer, a gate dielectric layer, a tantalum nitride layer, a tantalum oxynitride layer, an n type work function metal layer and a filling metal. The isolation layer is formed on a substrate, and the isolation layer has a first gate trench. The gate dielectric layer is formed in the first gate trench, the tantalum nitride layer is formed on the gate dielectric layer, and the tantalum oxynitride layer is formed on the tantalum nitride layer. The n type work function metal layer is formed on the tantalum oxynitride layer in the first gate trench, and the filling metal is formed on the n type work function metal layer in the first gate trench.

2 Claims, 7 Drawing Sheets

(51) Int. Cl.

|  |  |
|---|---|
| *H01L 29/51* | (2006.01) |
| *H01L 21/02* | (2006.01) |
| *H01L 21/28* | (2006.01) |
| *H01L 21/762* | (2006.01) |
| *H01L 27/088* | (2006.01) |
| *H01L 27/092* | (2006.01) |
| *H01L 21/8238* | (2006.01) |
| *H01L 21/3213* | (2006.01) |
| *H01L 21/8234* | (2006.01) |

(52) U.S. Cl.
CPC ............... *H01L 21/823431* (2013.01); *H01L 21/823821* (2013.01)

(56) References Cited

U.S. PATENT DOCUMENTS

| 2002/0119245 A1 | 8/2002 | Verhaverbeke |
| 2013/0009257 A1 | 1/2013 | Ando et al. |
| 2014/0203333 A1 | 7/2014 | Huang et al. |

\* cited by examiner

FIG. 6

SEMICONDUCTOR STRUCTURE AND MANUFACTURING METHOD THEREOF

This application is a divisional application of U.S. application Ser. No. 15/453,351, filed on Mar. 8, 2017, the entire content of which is incorporated herein by reference.

BACKGROUND

Technical Field

The present disclosure relates in general to a semiconductor structure and a manufacturing method thereof, and more particularly to a semiconductor structure for a CMOS FinFET and a manufacturing method thereof.

Description of the Related Art

Etching processes are widely applied in semiconductor manufacturing processes, for example, in patterning processes, removing undesired and/or sacrificing layer(s)/structure(s), and etc. However, in order to control intactness of the remained structure(s) in etching processes, etching stop layers are usually used to prevent over-etchings.

SUMMARY OF THE INVENTION

The present disclosure is directed to a semiconductor structure and a manufacturing method thereof. In the embodiments of the present disclosure, the tantalum oxynitride layer has a higher resistance to wet etching processes, thus the tantalum oxynitride layer on the tantalum nitride layer together used as an etching stop layer when a metal nitride layer formed thereon is removed by a wet etching process, the level of partial removal of the etching stop layer can be nicely controlled and minimized, and the control over the variation of the target threshold voltage (Vt) of the semiconductor structure can be further improved.

According to an embodiment of the present disclosure, a semiconductor structure is disclosed. The semiconductor structure includes an isolation layer, a gate dielectric layer, a tantalum nitride layer, a tantalum oxynitride layer, an n type work function metal layer and a filling metal. The isolation layer is formed on a substrate, and the isolation layer has a first gate trench. The gate dielectric layer is formed in the first gate trench, the tantalum nitride layer is formed on the gate dielectric layer, and the tantalum oxynitride layer is formed on the tantalum nitride layer. The n type work function metal layer is formed on the tantalum oxynitride layer in the first gate trench, and the filling metal is formed on the n type work function metal layer in the first gate trench.

According to another embodiment of the present disclosure, a manufacturing method of a semiconductor structure is disclosed. The manufacturing method of the semiconductor structure includes the following steps: forming a bottom barrier layer on a dielectric layer; forming a tantalum nitride layer on the bottom barrier layer; performing a dry oxidation process on the tantalum nitride layer for forming a tantalum oxynitride layer on the tantalum nitride layer; forming a work function metal layer on the tantalum oxynitride layer, the work function metal layer comprising at least one of TiN, TaN and TiAlN; and removing the work function metal layer by a wet etching process.

According to a further embodiment of the present disclosure, a manufacturing method of a semiconductor structure is disclosed. The manufacturing method of the semiconductor structure includes the following steps: forming an isolation layer on a substrate, the isolation layer having a first gate trench; forming a gate dielectric layer in the first gate trench; forming a bottom barrier layer on the gate dielectric layer; forming a tantalum nitride layer on the bottom barrier layer; performing a dry oxidation process on the tantalum nitride layer for forming a tantalum oxynitride layer on the tantalum nitride layer; forming a p type work function metal layer on the tantalum oxynitride layer, the p type work function metal layer comprising at least one of TiN, TaN and TiAlN; and removing the p type work function metal layer by a wet etching process.

The disclosure will become apparent from the following detailed description of the preferred but non-limiting embodiments. The following description is made with reference to the accompanying drawings.

DETAILED DESCRIPTION OF THE INVENTION

According to the embodiments of the present disclosure, a semiconductor structure and a manufacturing method thereof are provided. In the embodiments, the tantalum oxynitride layer has a higher resistance to wet etching processes, thus the tantalum oxynitride layer on the tantalum nitride layer together used as an etching stop layer when a metal nitride layer formed thereon is removed by a wet etching process, the level of partial removal of the etching stop layer can be nicely controlled and minimized, and the control over the variation of the target threshold voltage (Vt) of the semiconductor structure can be further improved. The embodiments are described in details with reference to the accompanying drawings. The procedures and details of the manufacturing method and the structure of the embodiments are for exemplification only, not for limiting the scope of protection of the disclosure. Moreover, the identical or similar elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

Figure 1:
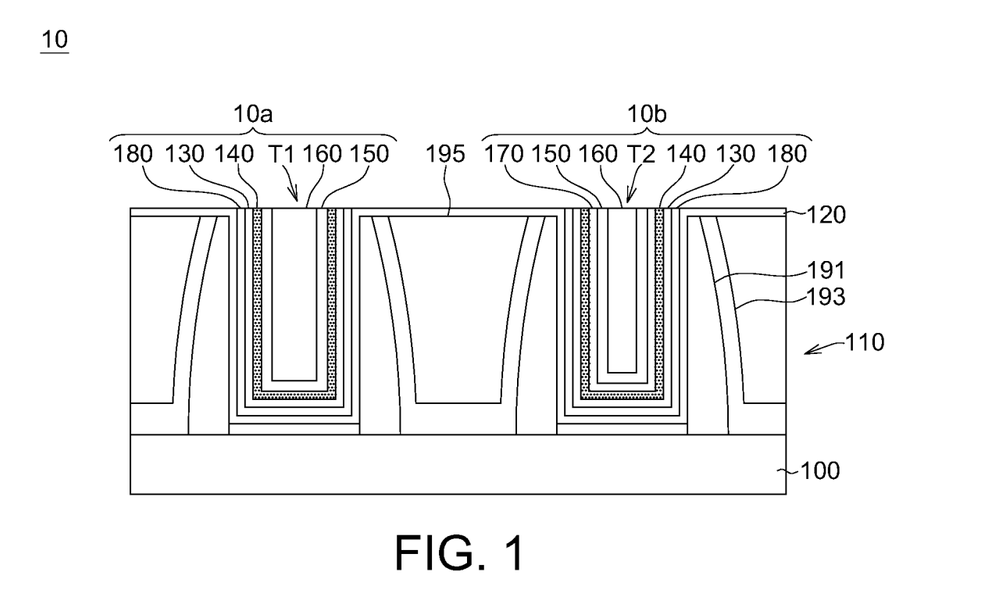
FIG. 1 is a schematic view of a semiconductor structure according to an embodiment of the present disclosure.

FIG. 1 is a schematic view of a semiconductor structure according to an embodiment of the present disclosure. As shown in FIG. 1, the semiconductor structure 10 includes an isolation layer 110, a gate dielectric layer 120, a tantalum nitride layer 130, a tantalum oxynitride layer 140, an n type work function metal layer 150 and a filling metal 160. The isolation layer 110 is formed on a substrate 100, and the isolation layer 110 has a first gate trench T1. The gate dielectric layer 120 is formed in the first gate trench T1, the tantalum nitride layer 130 is formed on the gate dielectric layer 120, and the tantalum oxynitride layer 140 is formed on the tantalum nitride layer 130. The n type work function metal layer 150 is formed on the tantalum oxynitride layer 140 in the first gate trench T1, and the filling metal 160 is formed on the n type work function metal layer 150 in the first gate trench T1.

According to the embodiments of the present disclosure, the tantalum oxynitride layer 140 has a higher resistance to wet etching processes, thus by forming the tantalum oxynitride layer 140 on the tantalum nitride layer 130 to be used as an etching stop layer when a metal nitride layer formed thereon is removed by a wet etching process, the level of partial removal of the etching stop layer (i.e. the etching amount of the tantalum oxynitride layer 140) can be nicely controlled and minimized, and the control over the variation of the target threshold voltage (Vt) of the semiconductor structure can be further improved.

In some embodiments, the gate dielectric layer 120 may be formed of a high-K dielectric material, for example, including at least one of $HfO_2$, $HfSiO_4$, HfSiON, $Al_2O_3$, $La_2O_3$, $Ta_2O_5$, $Y_2O_3$, $ZrO_2$, $SrTiO_3$, $ZrSiO_4$, $HfZrO_4$, SBT, PZT BST, or any combinations thereof. In some embodiments, the n type work function metal layer 150 may include at least one of TiAl, ZrAl, WAl, TaAl, HfAl, or any combinations thereof. In some embodiments, the filling metal 160 may include at least a material with low resistance and superior gap-filling characteristic, such as W, Al, TiAl, TiAlO, or any combinations thereof.

In the embodiment, as shown in FIG. 1, the isolation layer 110 may further include a second gate trench T2 separated from the first gate trench T1, the gate dielectric layer 120 is further formed in the second gate trench T2, the tantalum nitride layer 130 is further formed on the gate dielectric layer 120 in the second gate trench T2, and the tantalum oxynitride layer 140 is further formed on the tantalum nitride layer 130 in the second gate trench T2.

As shown in FIG. 1, the semiconductor structure 10 may further include a p type work function metal layer 170 formed on the tantalum oxynitride layer 140 in the second gate trench T2, and the p type work function metal layer 170 includes at least one of TiN, TaN and TiAlN. In one embodiment, the p type work function metal layer 170 is a TiN layer.

As shown in FIG. 1, in the embodiment, the isolation layer 110 may include spacers 191 located beside the first gate trench T1 and the second gate trench T2. In the embodiment, the spacers 191 may include SiN, SiO, SiON, or any combinations thereof. As shown in FIG. 1, in the embodiment, the isolation layer 110 may further include a contact etch stop layer (CESL) 193 formed on the spacers 191 and the substrate 100. As shown in FIG. 1, in the embodiment, the isolation layer 110 may further include an interlayer-dielectric 195 separating the first gate trench T1 and the second gate trench T2.

As shown in FIG. 1, the semiconductor structure 10 may further include a bottom barrier layer 180, such as a titanium nitride layer, and the bottom barrier layer 180 is formed between the gate dielectric layer 120 and the tantalum nitride layer 130.

In an embodiment, the semiconductor structure 10 may be a CMOS FinFET including a NFET 10a and a PFET 10b. In the present embodiment, the NFET 10a corresponds to the region of the first gate trench T1, and the PFET 10b corresponds to the region of the second gate trench T2. The substrate 100 may be a portion of a fin of the COMS FinFET.

Figure 2:
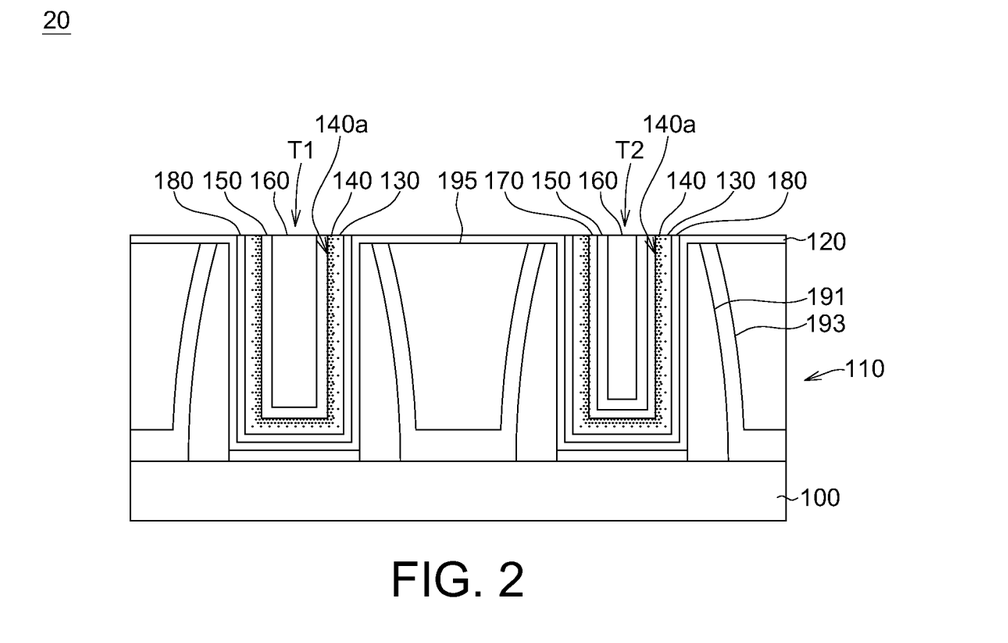
FIG. 2 is a schematic view of a semiconductor structure according to another embodiment of the present disclosure.

FIG. 2 is a schematic view of a semiconductor structure according to another embodiment of the present disclosure. The elements in the present embodiment sharing similar or the same labels with those in the previous embodiment are similar or the same elements, and the description of which is omitted.

As shown in FIG. 2, in the semiconductor structure 20, the tantalum oxynitride layer 140 may have a gradient oxygen concentration decreased from a top surface 140a of the tantalum oxynitride layer 140 toward the tantalum nitride layer 130. In other words, as shown in FIG. 2, the boundary between the tantalum nitride layer 130 and the tantalum oxynitride layer 140 is unobvious.

The embodiments disclosed below are for elaborating a manufacturing method of a semiconductor structure according to the disclosure. However, the descriptions disclosed in the embodiments of the disclosure such as detailed manufacturing procedures are for illustration only, not for limiting the scope of protection of the disclosure. Please refer to FIGS. 3A-3D, which show a manufacturing process of a semiconductor structure according to an embodiment of the present disclosure. The elements in the present embodiment sharing similar or the same labels with those in the previous embodiments are similar or the same elements, and the description of which is omitted.

Figure 3A:
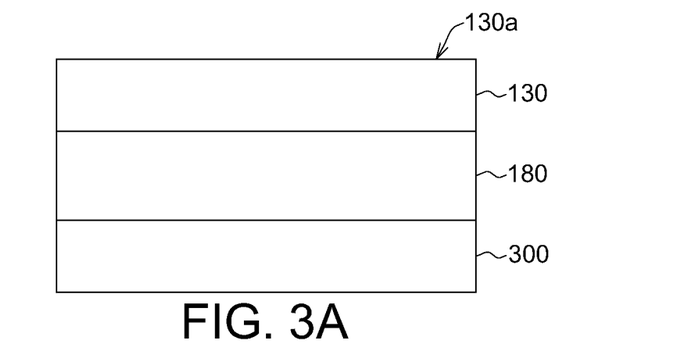
FIGS. 3A-3D show a manufacturing process of a semiconductor structure according to an embodiment of the present disclosure.

Please refer to FIG. 3A, a tantalum nitride layer 130 is formed on a dielectric layer 300. In the embodiment, a bottom barrier layer 180, such as a titanium nitride layer, is formed on the dielectric layer 300, and then the tantalum nitride layer 130 is formed on the bottom barrier layer 180.

Figure 3B:
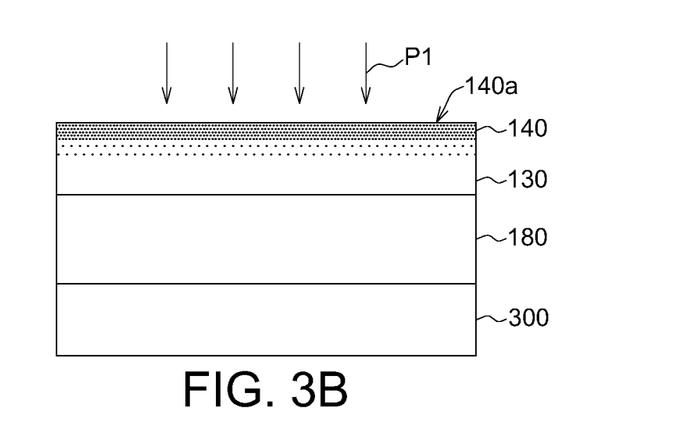

Please refer to FIG. 3B, a dry oxidation process P1 is performed on the tantalum nitride layer 130 for forming a tantalum oxynitride layer 140 on the tantalum nitride layer 130. In the embodiments of the present disclosure, it is important that only a dry oxidation process P1 can form the tantalum oxynitride layer 140 which is resistant to a wet etching process and can be used as an etching stop layer. If instead a wet oxidation process is performed on the tantalum nitride layer 130, tantalum oxide complexes may be formed in the oxidizing solution of the wet oxidation process, thereby prohibiting the formation of the desired tantalum oxynitride layer 140. In view of the above, according to the embodiments of the present disclosure, only by performing a dry oxidation process, the tantalum oxynitride layer 140 having an etching stop effect can be formed.

In some embodiments, performing the dry oxidation process P1 may include at least one of exposing the tantalum nitride layer 130 to air at room temperature, performing a plasma process on the tantalum nitride layer 130, and annealing the tantalum nitride layer 130 at a temperature of less than 200° C. The plasma process and the annealing process are preferably performed in an oxygen-containing environment. In some other embodiments, performing the dry oxidation process P1 may include providing an oxygen source, a nitrogen source and a tantalum source simultaneously for forming the tantalum oxynitride layer 140.

In the embodiments, the dry oxidation process P1 is performed on a surface 130a of the tantalum nitride layer 130.

In the embodiment, as shown in FIGS. 3A-3B, the dry oxidation process P1 is performed on the exposed top surface 130a of the tantalum nitride layer 130 by such as exposing the surface 130a of the tantalum nitride layer 130 to air at room temperature. As the tantalum nitride layer 130 is oxidized from the exposed surface 130a toward inside the tantalum nitride layer 130, the tantalum oxynitride layer 140 is formed, and the as-formed tantalum oxynitride layer 140 has a gradient oxygen concentration decreased from the top surface 140a, which is substantially the original exposed surface 130a of the tantalum nitride layer 130, of the tantalum oxynitride layer 140 toward the tantalum nitride layer 130.

Figure 3C:
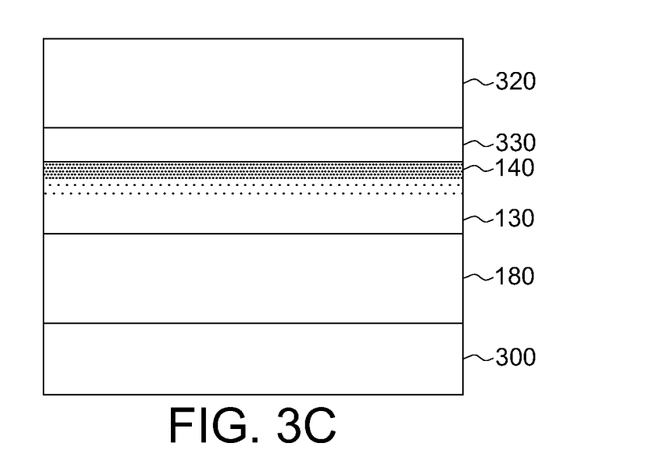

Next, please refer to FIG. 3C, a work function metal layer 320 is formed on the tantalum oxynitride layer 140, and the work function metal layer 320 may be a p type work function metal including at least one of TiN, TaN and TiAlN.

In the embodiments, in the process of forming the work function metal layer 320 including a metal nitride layer as aforementioned, e.g. titanium nitride layer, a nitridized tantalum nitride layer 330 may be formed between the work function metal layer 320 and the tantalum oxynitride layer 140. More specifically, the nitridized tantalum nitride layer 330 is formed by the additional nitridation of the tantalum oxynitride layer 140 by the formation of the work function metal layer 320. The difference between the nitridized tantalum nitride layer 330 and the tantalum oxynitride layer 140/the tantalum nitride layer 130 is in that the nitridized tantalum nitride layer 330 has a higher nitrogen content than those of the tantalum oxynitride layer 140 due to the effects of the additional nitridation by the formation of the work function metal layer 320.

Figure 3D:
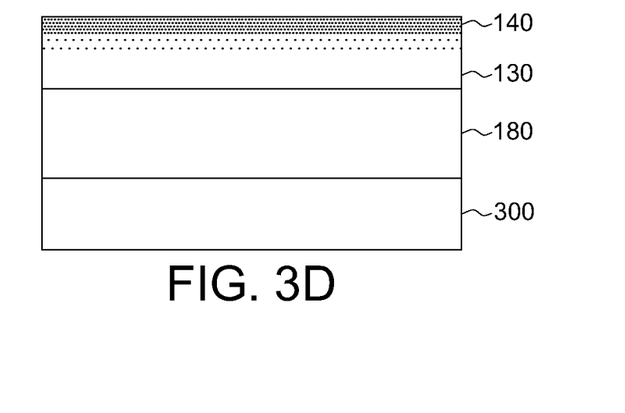

Next, please refer to FIG. 3D, the work function metal layer 320 is removed by a wet etching process. In the embodiment, the wet etching process may include applying an etching solution or a mixed solution of hydrochloric acid and aqueous hydrogen peroxide, which is also called a SC2 etching solution, on the work function metal layer 320. In the wet etching process, the work function metal layer 320 (e.g. TiN) is etched away by the SC2 etching solution, and the nitridized tantalum nitride layer 330 is also easily consumed by the SC2 etching solution.

In the embodiment, the etching solution or the mixed solution used for the wet etching process is free from hydrofluoric acid (HF). While the etching rate of the tantalum nitride layer 130 is relatively high in HF, according to the embodiments of the present disclosure, the wet etching process free of HF treatments can cause less etching damage to the tantalum nitride layer 130.

In addition, according to the embodiments of the present disclosure, the tantalum oxynitride layer 140 has a relatively high resistance to the SC2 etching solution, and thus very little etching damage is done to the tantalum oxynitride layer 140 when the work function metal layer 320 (e.g. TiN) is etched away by the SC2 etching solution; accordingly, the level of partial removal of the etching stop layer (i.e. the etching amount of the tantalum oxynitride layer 140) can be nicely controlled and minimized, and thus the control over the variation of the target threshold voltage (Vt) of the semiconductor structure can be further improved.

In view of the above, in the embodiment, the nitridized tantalum nitride layer 330 and the work function metal layer 320 are removed in the same wet etching process, and the tantalum oxynitride layer 140 and the tantalum nitride layer 130 remain substantially intact with very minor etching loss.

FIGS. 4A-4E show a manufacturing process of a semiconductor structure according to another embodiment of the present disclosure. The elements in the present embodiment sharing similar or the same labels with those in the previous embodiments are similar or the same elements, and the description of which is omitted.

Figure 4A:
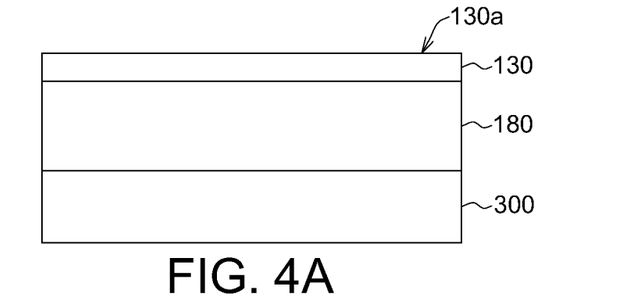
FIGS. 4A-4E show a manufacturing process of a semiconductor structure according to another embodiment of the present disclosure.

Please refer to FIG. 4A, a tantalum nitride layer 130 is formed on a dielectric layer 300. In the embodiment, a bottom barrier layer 180, such as a titanium nitride layer, is formed on the dielectric layer 300, and then the tantalum nitride layer 130 is formed on the bottom barrier layer 180.

Figure 4B:
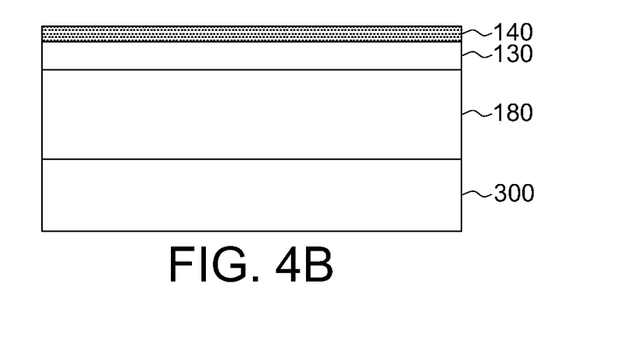

Please refer to FIG. 4B, a dry oxidation process is performed on the tantalum nitride layer 130 for forming a tantalum oxynitride layer 140 on the tantalum nitride layer 130. In the embodiments, the dry oxidation process is performed on a surface 130a of the tantalum nitride layer 130.

In the embodiment, as shown in FIGS. 4A-4B, the dry oxidation process is performed on the surface 130a of the tantalum nitride layer 130 by such as providing an oxygen source, a nitrogen source and a tantalum source simultaneously for forming the tantalum oxynitride layer 140. To be more clear, in the beginning, a nitrogen source and a tantalum source are provided to react and form the tantalum nitride layer 130, and after the tantalum nitride layer 130 is formed, with the nitrogen source and the tantalum source continuously provided, an oxygen source is further provided to react with the continuously provided nitrogen source and tantalum source, and thus the tantalum oxynitride layer 140 is formed on the tantalum nitride layer 130.

Figure 4C:
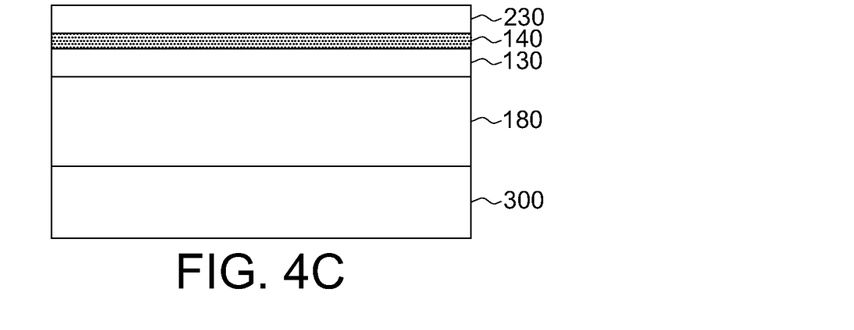

Next, please refer to FIG. 4C, an additional tantalum nitride layer 230 is formed on the tantalum oxynitride layer 140.

Figure 4D:
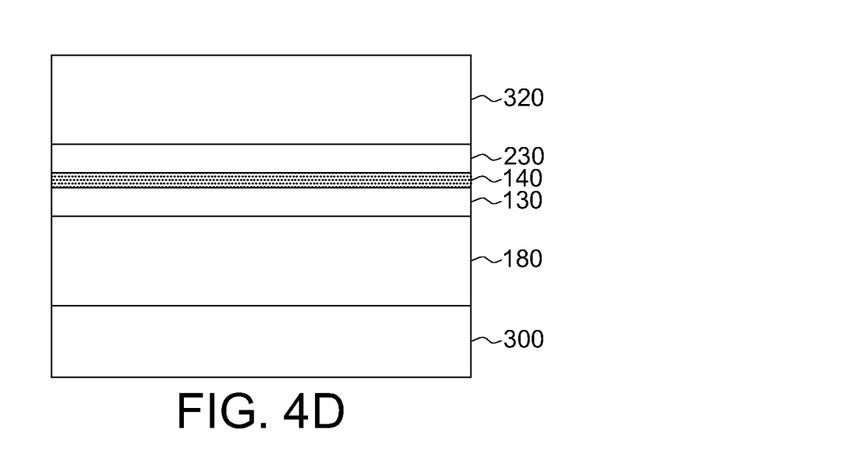

Next, please refer to FIG. 4D, a work function metal layer 320 is formed on the tantalum oxynitride layer 140, and the work function metal layer 320 may be a p type work function metal including at least one of TiN, TaN and TiAlN. In the embodiment, as shown in FIG. 4D, the work function metal layer 320 is formed on the additional tantalum nitride layer 230. The additional tantalum nitride layer 230 serves as a sacrificial layer interposed between the work function metal layer 320 and the tantalum oxynitride layer 140, such that occurrence of undesired nitridation of the tantalum oxynitride layer 140 by the deposition of the work function metal layer 320 can be effectively prevented.

Figure 4E:
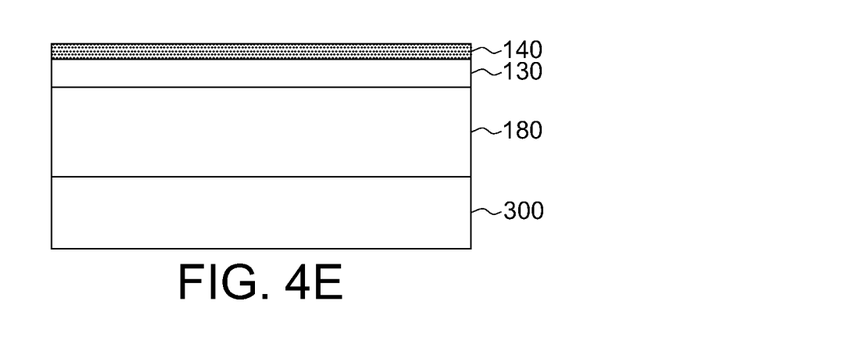

Next, please refer to FIG. 4E, the work function metal layer 320 is removed by a wet etching process. In the embodiment, the wet etching process may include applying an etching solution or a mixed solution of hydrochloric acid and aqueous hydrogen peroxide on the work function metal layer 320. In the embodiment, the etching solution is free from HF, and the mixed solution is free from HF. In the embodiment, the additional tantalum nitride layer 230 is removed by the same wet etching process which removes the work function metal layer 320, and the tantalum oxynitride layer 140 and the tantalum nitride layer 130 remain substantially intact with very minor etching loss.

FIGS. 5A-5E show a manufacturing process of a semiconductor structure according to a further embodiment of the present disclosure. The elements in the present embodiment sharing similar or the same labels with those in the previous embodiments are similar or the same elements, and the description of which is omitted.

Figure 5A:
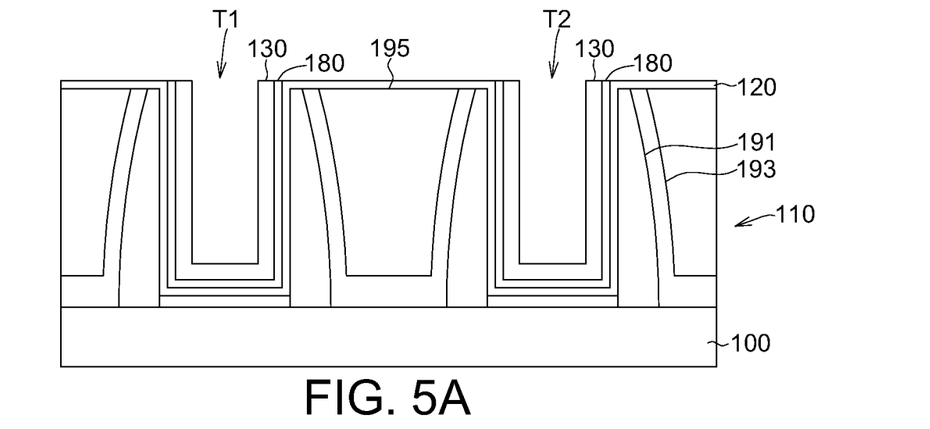
FIGS. 5A-5E show a manufacturing process of a semiconductor structure according to a further embodiment of the present disclosure.

Please refer to FIG. 5A, an isolation layer 110 having a first gate trench T1 is formed on a substrate 100, a gate dielectric layer 120 is formed in the first gate trench T1, and a tantalum nitride layer 130 is formed on the gate dielectric layer 120. In the embodiment, the isolation layer 110 further has a second gate trench T2 separated from the first gate trench T1 by an interlayer-dielectric 195, and the first gate trench T1 and the second gate trench T2 are formed by the same process, e.g. the same patterning process.

In the embodiment, as shown in FIG. 5A, a bottom barrier layer 180 may be formed after the formation of the gate dielectric layer 120 and prior to the formation of the tantalum nitride layer 130; that is, the bottom barrier layer 180 is formed on the gate dielectric layer 120, and the tantalum nitride layer 130 is formed on the bottom barrier layer 180. In the embodiment, as shown in FIG. 5A, the formation of the isolation layer 110 may include forming the spacers 191, the contact etch stop layer (CESL) 193 and the interlayer-dielectric 195.

Figure 5B:
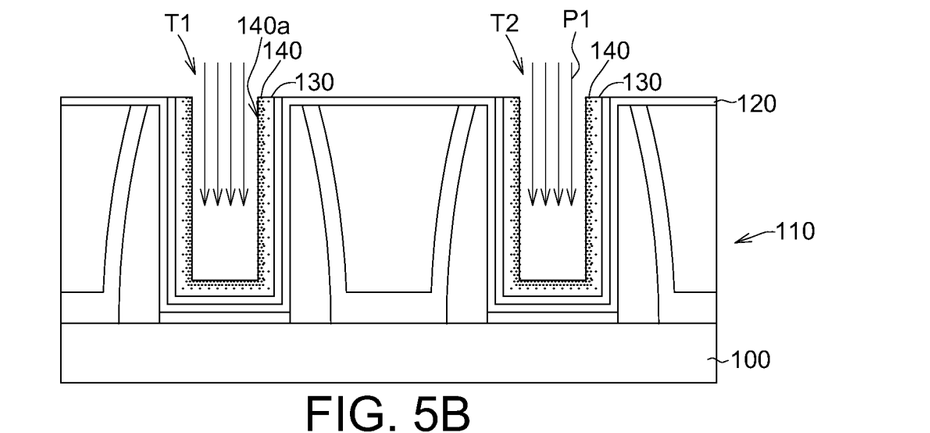

Please refer to FIG. 5B, a dry oxidation process P1 is performed on the tantalum nitride layer 130 for forming a tantalum oxynitride layer 140 on the tantalum nitride layer 130.

In the embodiments, the dry oxidation process P1 is performed on the surface 130a of the tantalum nitride layer 130. According to the embodiments of the present disclosure, performing the dry oxidation process may include any of the following processes: exposing the tantalum nitride layer 130 to air at room temperature, performing a plasma process on the tantalum nitride layer 130, annealing the tantalum nitride layer 130 at a temperature of less than 200° C., and providing an oxygen source, a nitrogen source and a tantalum source simultaneously for forming the tantalum oxynitride layer 140.

In the present embodiment, as shown in FIG. 5B, the dry oxidation process P1 is performed by exposing the tantalum nitride layer 130 to air at room temperature. While the tantalum oxynitride layer 140 is formed by oxidizing the tantalum nitride layer 130 with air, the as-formed tantalum oxynitride layer 140 has a gradient oxygen concentration decreased from the top surface 140a of the tantalum oxynitride layer toward the tantalum nitride layer 130, and thus as shown in FIG. 5B, the boundary between the tantalum nitride layer 130 and the tantalum oxynitride layer 140 is unobvious.

As shown in FIG. 5B, the tantalum oxynitride layer 140 is formed on the tantalum nitride layer 130 in both of the first gate trench T1 and the second gate trench T2.

Figure 5C:
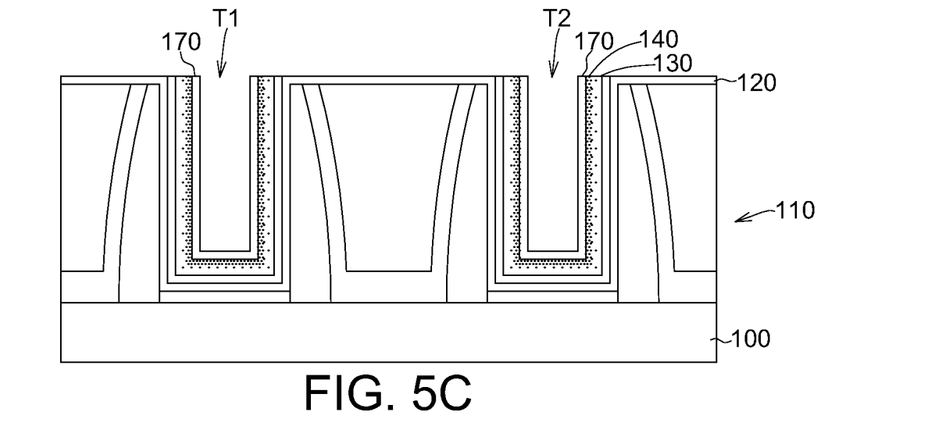

Please refer to FIG. 5C, a p type work function metal layer 170 is formed on the tantalum oxynitride layer 140, and the p type work function metal layer 170 includes at least one of TiN, TaN and TiAlN. In the embodiment, the p type work function metal layer 170 is formed in both of the first gate trench T1 and the second gate trench T2.

Figure 5D:
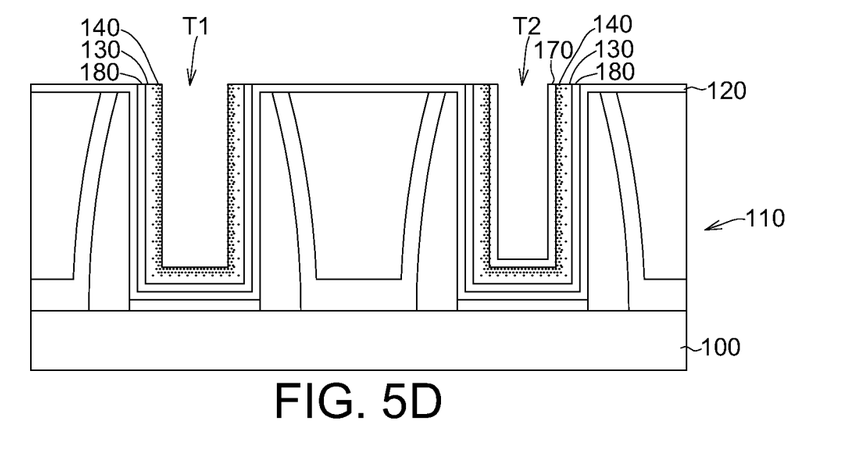

Please refer to FIG. 5D, the p type work function metal layer 170 is removed by a wet etching process. In the embodiment, only the p type work function metal layer 170 in the first gate trench T1 is removed by the wet etching process, and the p type work function metal layer 170 in the second gate trench T2 is protected from any damage from the etching process and remains intact.

In the embodiment, the wet etching process is performed by applying an etching solution or a mixed solution of hydrochloric acid and aqueous hydrogen peroxide on the p type work function metal layer 170 in the first gate trench T1. In the embodiment, the etching solution is free from HF, and the mixed solution is free from HF.

Figure 5E:
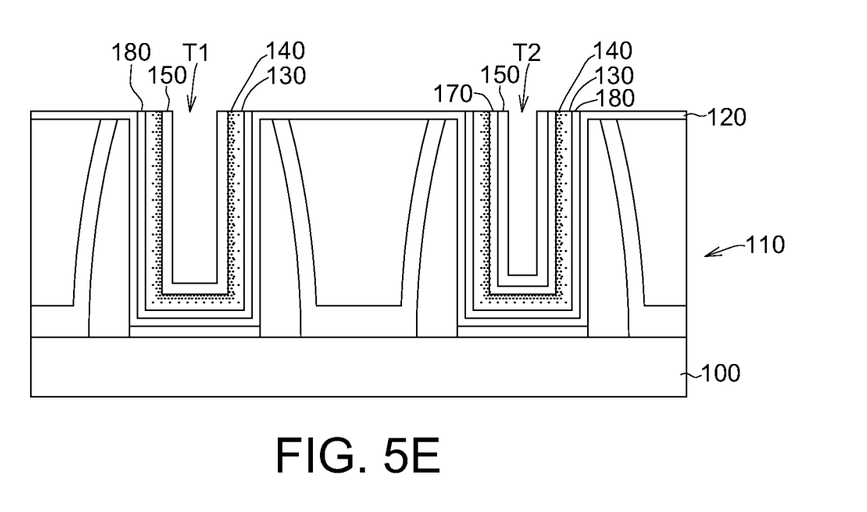

Next, please refer to FIG. 5E, an n type work function metal layer 150 is formed on the tantalum oxynitride layer 140 after the p type work function metal 170 is removed. In the embodiment, as shown in FIG. 5E, the n type work function metal layer 150 is formed on the tantalum oxynitride layer 140 in the first gate trench T1 and on the p type work function metal layer 170 in the second gate trench T2.

Next, please refer to FIG. 2, a filling metal 160 is formed on the n type work function metal layer 150 in the first gate trench T1. In the embodiment, the filling metal 160 is also formed on the n type work function metal layer 150 in the second gate trench T2, thus forming the semiconductor structure 20 as shown in FIG. 2.

In some other embodiments, by applying the method described accompanying FIG. 4B to the manufacturing method as illustrated by FIGS. 5A-5E, the semiconductor structure 10 as shown in FIG. 1 may be formed as well.

In some other embodiments, in the step as shown in FIG. 5B, after the tantalum oxynitride layer 140 is formed, an additional tantalum nitride layer 230 may be formed on the tantalum oxynitride layer 140, and then the additional tantalum nitride layer 230 in the first gate trench T1 is removed by the wet etching process for removing the p type work function metal layer 170. As such, a semiconductor structure with an additional tantalum nitride layer 230 formed between the tantalum oxynitride layer 140 and the p type work function metal layer 170 in the second gate trench T2 is formed (not shown in drawings).

Further explanation is provided with the following examples. Embodiments and comparative embodiments are listed for showing the properties and effects of the semiconductor structure and the manufacturing method thereof according to the embodiments of the disclosure. However, the following examples are for purposes of describing particular embodiments only, and are not intended to be limiting.

Figure 6:
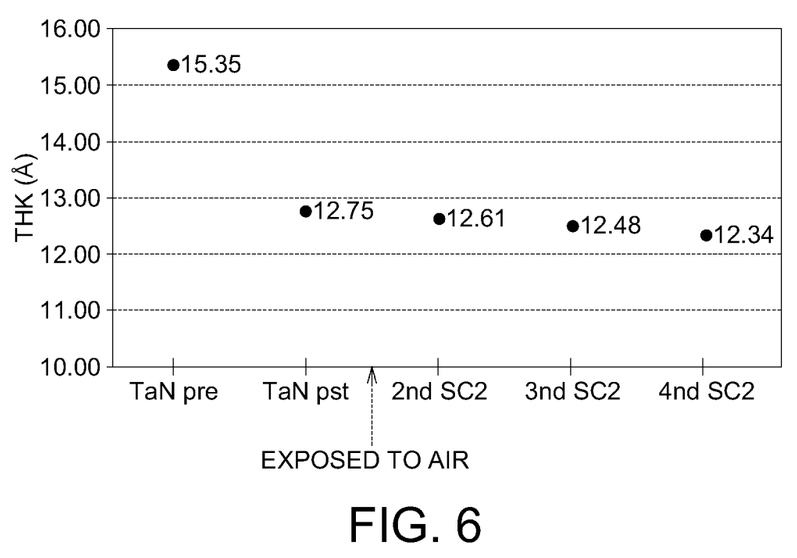
FIG. 6 shows the thickness variation of a tantalum nitride layer in a manufacturing process according to an embodiment of the present disclosure.

FIG. 6 shows the thickness variation of a tantalum nitride layer in a manufacturing process according to an embodiment of the present disclosure. In the present example, the sample of embodiment 1 undergoes the following process: providing a silicon substrate; depositing a TaN film on the silicon substrate (TaN pre); depositing a TiN film on the TaN film; first SC2 etching of the TiN/TaN film for 234 seconds (TaN pst); exposing the TiN/TaN film to air; second SC2 etching of the TiN/TaN film for 234 seconds (2nd SC2); third SC2 etching of the TiN/TaN film for 234 seconds (3rd SC2); and fourth SC2 etching of the TiN/TaN film for 234 seconds (4th SC2); and the sample of comparative embodiment 1 undergoes the following process: providing a silicon substrate; depositing a TaN film on the silicon substrate; depositing a TiN film on the TaN film; and SC2 etching of the TiN/TaN film for 749 seconds.

In the present example, the etching processes are intended to remove the deposited TiN film, and the deposited TaN film is intended to serve as an etching stop layer for protecting the silicon substrate from etching damages. The thickness of the TaN film is measured to examine the etching stop effect.

In comparative embodiment 1, after performed with the SC2 etching process for 749 seconds continuously, which is 515 seconds longer than the first SC2 etching process in embodiment 1, without performing any dry oxidation process on the TaN film, a thickness loss of 1.01 Å is caused by the additional 515 seconds of the SC2 etching process, indicating an etching loss rate of 0.118 Å/min. On the contrary, in embodiment 1 as shown in FIG. 6, after performed with the first SC2 etching process (TaN pst), a dry oxidation process is performed by exposing the TiN/TaN film to air, and presumably an TaON film is formed on the TaN film, such that the following three SC2 etching processes (2nd SC2, 3rd SC2, and 4th SC2) in total for 702 seconds only cause an overall thickness loss of 0.42 Å, indicating an etching loss rate of only 0.036 Å/min, which is significantly smaller than the thickness loss in one single SC2 etching process of the sample in comparative embodiment 1. In view of the above, it is evidently that the manufacturing process according to the embodiment of the present disclosure, where a dry oxidation process is performed on a TaN film, is provided with less etching loss, smaller etching rate, and a better protection from the etching damages.

Another example is provided in the following table. In table 1, the sample of embodiment 2 undergoes the following process: providing a silicon substrate; depositing a TaN film on the silicon substrate (TaN pre); performing a plasma process on the TaN film in an oxygen-containing environment; depositing a TiN film on the plasma-treated TaN film; and SC2 etching of the TiN/TaN film (TaN pst); and the sample of comparative embodiment 2 undergoes the following process: providing a silicon substrate; depositing a TaN film on the silicon substrate (TaN pre); depositing a TiN film on the TaN film; and SC2 etching of the TiN/TaN film (TaN pst).

TABLE 1

|  | Comparative embodiment 2 | Embodiment 2 |
|---|---|---|
| Thickness of TaN film after TaN pre step | 15.85 Å | 15.95 Å |
| Thickness of TaN film after TaN pst step | 13.17 Å | 13.53 Å |
| Etching loss | 2.68 Å | 2.42 Å |

As shown in table 1, in comparative embodiment 2, after performed with the SC2 etching process for removing the TiN film, without performing any dry oxidation process on the TaN film, a thickness loss of 2.68 Å is caused by the SC2 etching process. On the contrary, in embodiment 2, a dry oxidation process is performed by performing a plasma process between the step of formation of the TiN film and the step of formation of the TaN film in an oxygen-rich environment, and presumably an TaON film is formed on the TaN film, such that the following SC2 etching process only causes a thickness loss of 2.42 Å, which is smaller than the thickness loss of the sample in comparative embodiment 2. In view of the above, it is evidently that the manufacturing process according to the embodiment of the present disclosure, where a dry oxidation process is performed on a TaN film, is provided with less etching loss and a better protection from the etching damages.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
an isolation layer on a substrate, the isolation layer having a first gate trench;
a gate dielectric layer in the first gate trench;
a tantalum nitride layer on the gate dielectric layer;
a tantalum oxynitride layer on the tantalum nitride layer;
an n type work function metal layer formed on the tantalum oxynitride layer in the first gate trench; and
a filling metal formed on the n type work function metal layer in the first gate trench;
wherein the tantalum oxynitride layer has a gradient oxygen concentration decreased from a top surface of the tantalum oxynitride layer toward the tantalum nitride layer.

2. The semiconductor structure according to claim 1, wherein the isolation layer further comprises a second gate trench separated from the first gate trench, the gate dielectric layer is further formed in the second gate trench, the tantalum nitride layer is further formed on the gate dielectric layer in the second gate trench, the tantalum oxynitride layer is further formed on the tantalum nitride layer in the second gate trench, and the semiconductor structure further comprises a p type work function metal layer formed on the tantalum oxynitride layer in the second gate trench, the p type work function metal layer comprising at least one of TiN, TaN and TiAlN.

* * * * *